US012599042B2

(12) United States Patent
Liang et al.

(10) Patent No.: US 12,599,042 B2
(45) Date of Patent: Apr. 7, 2026

(54) CARRIER STRUCTURE AND METHODS OF FORMING THE SAME

(71) Applicant: TAIWAN SEMICONDUCTOR MANUFACTURING COMPANY, LTD., Hsinchu (TW)

(72) Inventors: Zheng Yong Liang, Kaohsiung (TW); Wei-Ting Yeh, Hsinchu (TW); Jyh-Cherng Sheu, Hsinchu (TW); Yu-Yun Peng, Hsinchu (TW); Keng-Chu Lin, Ping-Tung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 438 days.

(21) Appl. No.: 18/112,853

(22) Filed: Feb. 22, 2023

(65) Prior Publication Data

US 2024/0282761 A1 Aug. 22, 2024

(51) Int. Cl.
| | |
|---|---|
| *H01L 21/00* | (2006.01) |
| *H01L 21/02* | (2006.01) |
| *H01L 21/768* | (2006.01) |
| *H01L 23/522* | (2006.01) |
| *H01L 25/18* | (2023.01) |

(52) U.S. Cl.
CPC ........ *H01L 25/18* (2013.01); *H01L 21/02016* (2013.01); *H01L 21/02186* (2013.01); *H01L 21/0231* (2013.01); *H01L 21/02334* (2013.01); *H01L 21/76822* (2013.01); *H01L 23/5226* (2013.01)

(58) Field of Classification Search
CPC ............... H01L 21/187; H01L 21/7806; H01L 21/7813; H01L 21/6835; H01L 21/0231; H01L 2221/68318; H01L 2221/68322; H01L 2221/6835; H01L 2221/68377; H01L 2221/68381
See application file for complete search history.

(56) References Cited

U.S. PATENT DOCUMENTS

| | | |
|---|---|---|
| 7,262,088 B2 | 8/2007 | Kodaira et al. |
| 10,164,144 B2 | 12/2018 | Henley et al. |
| 10,269,589 B2 | 4/2019 | Tsou et al. |
| 11,908,708 B2 | 2/2024 | Chang et al. |

(Continued)

FOREIGN PATENT DOCUMENTS

| | | |
|---|---|---|
| TW | 360901 B | 6/1999 |

*Primary Examiner* — Reema Patel
(74) *Attorney, Agent, or Firm* — NZ Carr Law Office

(57) ABSTRACT

A carrier structure and methods of forming and using the same are described. In some embodiments, the method includes forming one or more devices over a substrate, forming a first interconnect structure over the one or more devices, and bonding the first interconnect structure to a carrier structure. The carrier structure includes a semiconductor substrate, a release layer, and a first dielectric layer, and the release layer includes a metal nitride. The method further includes flipping over the one or more devices so the carrier structure is located at a bottom, performing backside processes, flipping over the one or more devices so the carrier structure is located at a top, and exposing the carrier structure to IR lights. Portions of the release layer are separated from the first dielectric layer.

20 Claims, 11 Drawing Sheets

(56)　　　　　References Cited

U.S. PATENT DOCUMENTS

| 2016/0013147 | A1* | 1/2016 | Cheng | H01L 24/19 |
| | | | | 438/109 |
| 2021/0351118 | A1 | 11/2021 | Tsai et al. | |
| 2022/0028721 | A1 | 1/2022 | Lin et al. | |
| 2022/0199465 | A1 | 6/2022 | Wu et al. | |
| 2023/0178404 | A1* | 6/2023 | Horibe | H01L 21/6835 |
| | | | | 438/16 |

* cited by examiner

CARRIER STRUCTURE AND METHODS OF FORMING THE SAME

BACKGROUND

The semiconductor industry has continually improved the processing capabilities and power consumption of integrated circuits (ICs) by shrinking the minimum feature size. However, in recent years, process limitations have made it difficult to continue shrinking the minimum feature size. The stacking of two-dimensional (2D) ICs into three-dimensional (3D) ICs has emerged as a potential approach to continue improving processing capabilities and power consumption of ICs. For example, in wafer-to-wafer multi-stacking applications, the wafers bonding process with backside process can improve the high-density routing issue. Such bonding processes utilize sophisticated techniques, and improvements are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
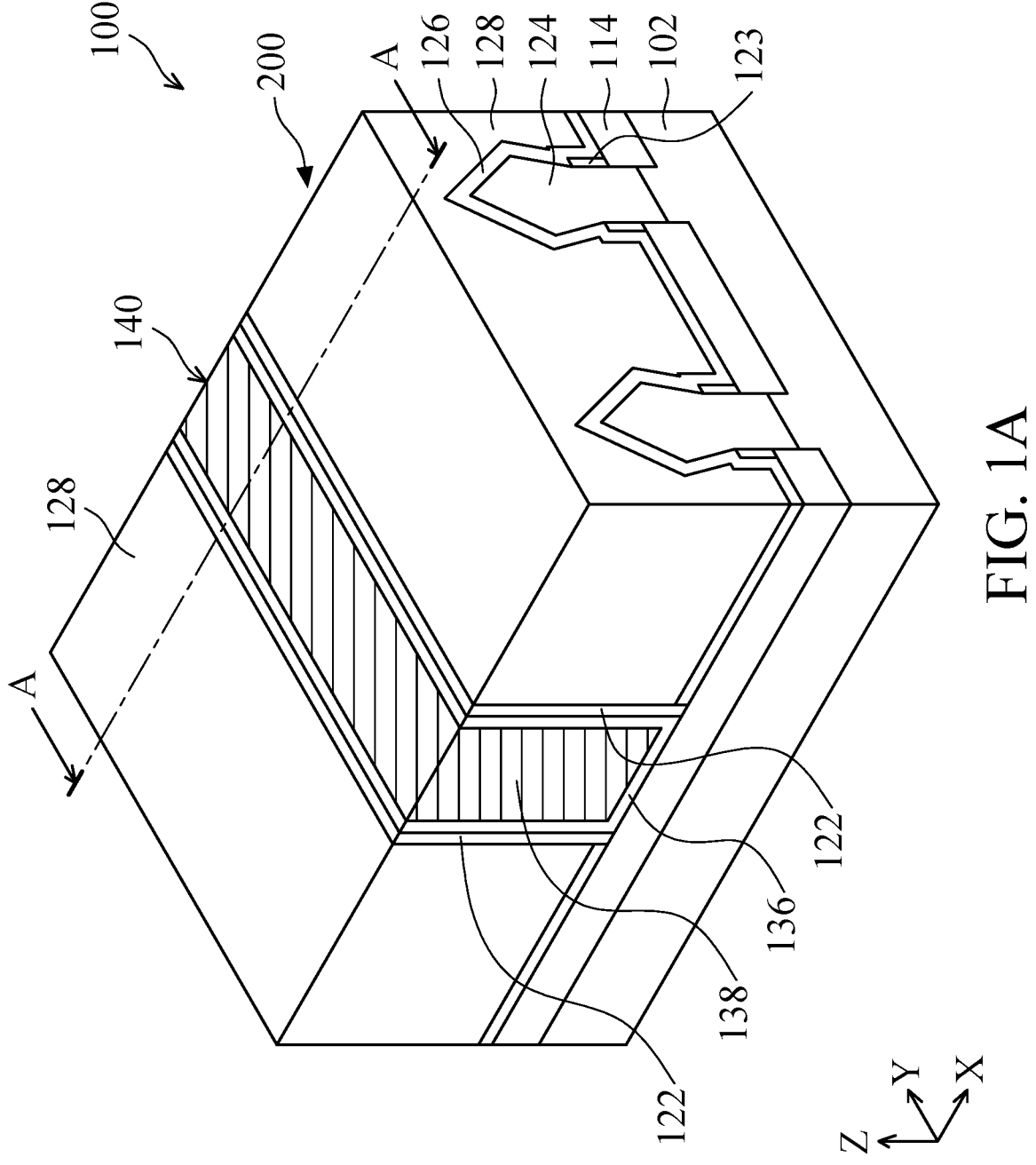
FIG. 1A is a perspective view of one of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
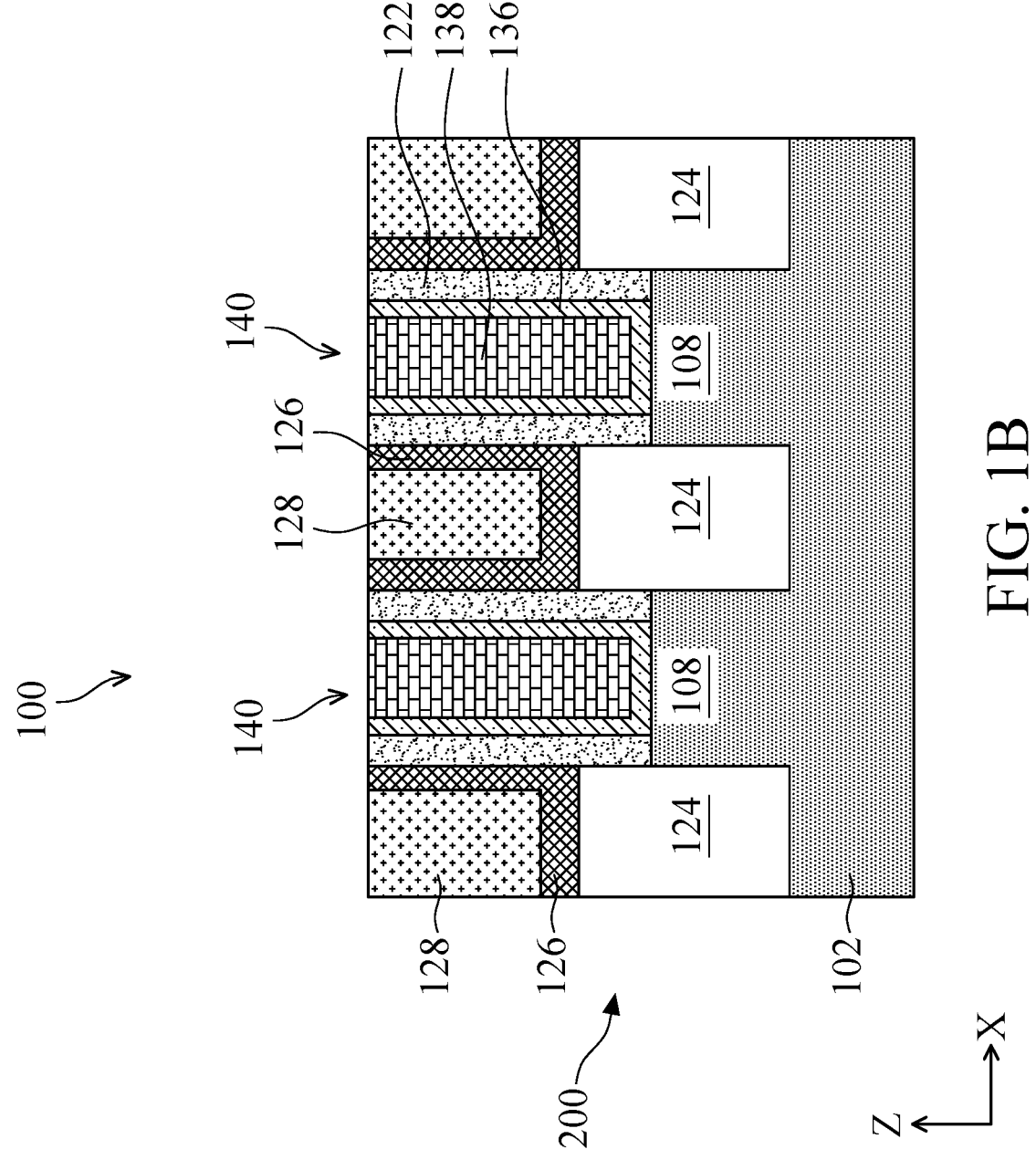
FIG. 1B is a cross-sectional side view of the stage of manufacturing the semiconductor device structure taken along line A-A of FIG. 1A, in accordance with some embodiments.

FIGS. 1A and 1B illustrate a stage of manufacturing a semiconductor device structure 100. As shown in FIGS. 1A and 1B, the semiconductor device structure 100 includes a substrate 102 and one or more devices 200 formed on the substrate 102. The substrate 102 may be a semiconductor substrate. In some embodiments, the substrate 102 includes a single crystalline semiconductor layer on at least the surface of the substrate 102. The substrate 102 may include a crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb), and indium phosphide (InP). For example, the substrate 102 is made of Si. In some embodiments, the substrate 102 is a silicon-on-insulator (SOI) substrate, which includes an insulating layer (not shown) disposed between two silicon layers. In one aspect, the insulating layer is an oxygen-containing material, such as an oxide.

The substrate 102 may include one or more buffer layers (not shown) on the surface of the substrate 102. The buffer layers can serve to gradually change the lattice constant from that of the substrate to that of the source/drain regions. The buffer layers may be formed from epitaxially grown crystalline semiconductor materials such as, but not limited to Si, Ge, germanium tin (GeSn), SiGe, GaAs, InSb, GaP, GaSb, InAlAs, InGaAs, GaSbP, GaAsSb, GaN, and InP.

The substrate 102 may include various regions that have been suitably doped with impurities (e.g., p-type or n-type impurities). The dopants are, for example phosphorus for an n-type fin field effect transistor (FinFET) and boron for a p-type FinFET.

As described above, the devices 200 may be any suitable devices, such as transistors, diodes, imaging sensors, resistors, capacitors, inductors, memory cells, or a combination thereof. In some embodiments, the devices 200 are transistors, such as planar field effect transistors (FETs), FinFETs, nanostructure transistors, or other suitable transistors. The nanostructure transistors may include nanosheet transistors, nanowire transistors, gate-all-around (GAA) transistors, multi-bridge channel (MBC) transistors, or any transistors having the gate electrode surrounding the channels. An example of the device 200 formed on the substrate 102 is a FinFET, which is shown in FIGS. 1A and 1B. The device 200 includes source/drain (S/D) regions 124 and gate stacks 140 (only one is shown in FIG. 1A). Each gate stack 140 may be disposed between S/D regions 124 serving as source regions and S/D regions 124 serving as drain regions. For example, each gate stack 140 may extend along the Y-axis between one or more S/D regions 124 serving as source regions and one or more S/D regions 124 serving as drain regions. As shown in FIG. 1B, two gate stacks 140 are formed on the substrate 102. In some embodiments, more than two gate stacks 140 are formed on the substrate 102.

Channel regions 108 are formed between S/D regions 124 serving as source regions and S/D regions 124 serving as drain regions.

The S/D regions 124 may include a semiconductor material, such as Si or Ge, a III-V compound semiconductor, a II-VI compound semiconductor, or other suitable semiconductor material. Exemplary S/D region 124 may include, but are not limited to, Ge, SiGe, GaAs, AlGaAs, GaAsP, SiP, InAs, AlAs, InP, GaN, InGaAs, InAlAs, GaSb, AlP, GaP, and the like. The S/D regions 124 may include p-type dopants, such as boron; n-type dopants, such as phosphorus or arsenic; and/or other suitable dopants including combinations thereof. The S/D regions 124 may be formed by an epitaxial growth method using CVD, atomic layer deposition (ALD) or molecular beam epitaxy (MBE). In this disclosure, a source and a drain are interchangeably used, and the structures thereof are substantially the same. Furthermore, S/D region(s) may refer to a source or a drain, individually or collectively dependent upon the context.

The channel regions 108 may include one or more semiconductor materials, such as Si, Ge, GeSn, SiGe, GaAs, InSb, GaP, GaSb, InAlAs, InGaAs, GaSbP, GaAsSb, GaN, or InP. In some embodiments, the channel regions 108 include the same semiconductor material as the substrate 102. In some embodiments, the devices 200 are FinFETs, and the channel regions 108 are a plurality of fins disposed below the gate stacks 140. In some embodiments, the devices 200 are nanostructure transistors, and the channel regions 108 are surrounded by the gate stacks 140.

As shown in FIGS. 1A and 1B, each gate stack 140 includes a gate electrode layer 138 disposed over the channel region 108 (or surrounding the channel region 108 for nanostructure transistors). The gate electrode layer 138 may be a metal-containing material such as tungsten, cobalt, aluminum, ruthenium, copper, multilayers thereof, or the like, and can be deposited by ALD, plasma enhanced chemical vapor deposition (PECVD), MBD, physical vapor deposition (PVD), or any suitable deposition technique. Each gate stack 140 may further include a gate dielectric layer 136 disposed over the channel region 108. The gate electrode layer 138 may be disposed over the gate dielectric layer 136. In some embodiments, an interfacial layer (not shown) may be disposed between the channel region 108 and the gate dielectric layer 136, and one or more work function layers (not shown) may be formed between the gate dielectric layer 136 and the gate electrode layer 138. The interfacial dielectric layer may include a dielectric material, such as an oxygen-containing material or a nitrogen-containing material, or multilayers thereof, and may be formed by any suitable deposition method, such as CVD, PECVD, or ALD. The gate dielectric layer 136 may include a dielectric material such as an oxygen-containing material or a nitrogen-containing material, a high-k dielectric material having a k value greater than that of silicon dioxide, or multilayers thereof. The gate dielectric layer 136 may be formed by any suitable method, such as CVD, PECVD, or ALD. In some embodiments, the gate dielectric layer 136 may be a conformal layer. The term "conformal" may be used herein for ease of description upon a layer having substantial same thickness over various regions. The one or more work function layers may include aluminum titanium carbide, aluminum titanium oxide, aluminum titanium nitride, or the like.

Gate spacers 122 are formed along sidewalls of the gate stacks 140 (e.g., sidewalls of the gate dielectric layers 136). The gate spacers 122 may include silicon oxycarbide, silicon nitride, silicon oxynitride, silicon carbon nitride, the like, multi-layers thereof, or a combination thereof, and may be deposited by CVD, ALD, or other suitable deposition technique.

As shown in FIG. 1A, fin sidewall spacers 123 may be disposed on opposite sides of each S/D region 124, and the fin sidewall spacers 123 may include the same material as the gate spacers 122. Portions of the gate stacks 140, the gate spacers 122, and the fin sidewall spacers 123 may be disposed on isolation regions 114. The isolation regions 114 are disposed on the substrate 102. The isolation regions 114 may include an insulating material such as an oxygen-containing material, a nitrogen-containing material, or a combination thereof. In some embodiments, the isolation regions 114 are shallow trench isolation (STI). The insulating material may be formed by a high-density plasma chemical vapor deposition (HDP-CVD), a flowable chemical vapor deposition (FCVD), or other suitable deposition process. In one aspect, the isolation regions 114 includes silicon oxide that is formed by a FCVD process.

As shown in FIGS. 1A and 1, a contact etch stop layer (CESL) 126 is formed on the S/D regions 124 and the isolation region 114, and an interlayer dielectric (ILD) layer 128 is formed on the CESL 126. The CESL 126 can provide a mechanism to stop an etch process when forming openings in the ILD layer 128. The CESL 126 may be conformally deposited on surfaces of the S/D regions 124 and the isolation regions 114. The CESL 126 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be deposited by CVD, PECVD, ALD, or any suitable deposition technique. The ILD layer 128 may include an oxide formed by tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), organosilicate glass (OSG), SiOC, and/or any suitable low-k dielectric materials (e.g., a material having a dielectric constant lower than that of silicon dioxide), and may be deposited by spin-on, CVD, FCVD, PECVD, PVD, or any suitable deposition technique.

A conductive contact (not shown) may be disposed in the ILD layer 128 and over the S/D region 124. The conductive contact may be electrically conductive and include a material having one or more of Ru, Mo, Co, Ni. W, Ti, Ta, Cu, Al, TiN or TaN, and the conductive contact may be formed by any suitable method, such as electro-chemical plating (ECP), or PVD. A silicide layer (not shown) may be disposed between the conductive contact and the S/D region 124.

Figure 2:
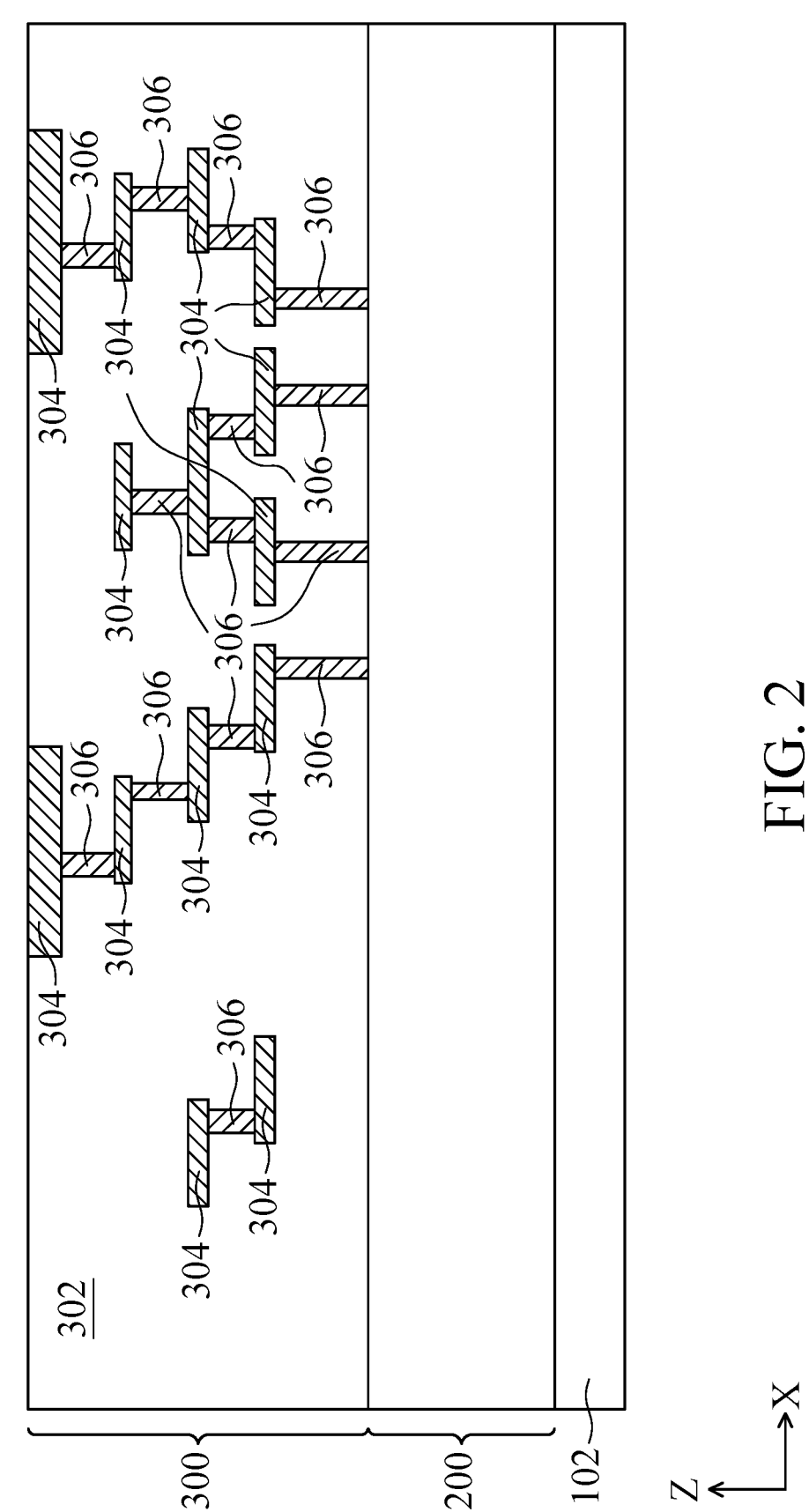
FIG. 2 is a cross-sectional side view of a stage of manufacturing the semiconductor device structure, in accordance with some embodiments.

The semiconductor device structure 100 may further includes an interconnect structure 300 disposed over the devices 200 and the substrate 102, as shown in FIG. 2. The interconnect structure 300 includes various conductive features, such as a first plurality of conductive features 304 and second plurality of conductive features 306, and an inter-metal dielectric (IMD) layer 302 to separate and isolate various conductive features 304, 306. In some embodiments, the first plurality of conductive features 304 are conductive lines and the second plurality of conductive features 306 are conductive vias. The interconnect structure 300 includes multiple levels of the conductive features 304, and the conductive features 304 are arranged in each level to provide electrical paths to various devices 200 disposed below. The conductive features 306 provide vertical electrical routing from the devices 200 to the conductive features 304 and between conductive features 304. For example, the bottommost conductive features 306 of the interconnect structure 300 may be electrically connected to the conductive contacts disposed over the S/D regions 124 (FIG. 1B) and the gate electrode layer 138 (FIG. 1B). The conductive features 304 and conductive features 306 may be made from one or more electrically conductive materials, such as metal, metal alloy, metal nitride, or silicide. For example, the conductive features 304 and the conductive features 306 are made from copper, aluminum, aluminum copper alloy, titanium, titanium nitride, tantalum, tantalum nitride, titanium silicon nitride, zirconium, gold, silver, cobalt, nickel, tungsten, tungsten nitride, tungsten silicon nitride, platinum, chromium, molybdenum, hafnium, other suitable conductive material, or a combination thereof.

The IMD layer 302 includes one or more dielectric materials to provide isolation functions to various conductive features 304, 306. The IMD layer 302 may include multiple dielectric layers embedding multiple levels of conductive features 304, 306. The IMD layer 302 is made from a dielectric material, such as $SiO_x$, $SiO_xC_yH_z$, or $SiO_xC_y$, where x, y and z are integers or non-integers. In some embodiments, the IMD layer 302 includes a dielectric material having a k value ranging from about 1 to about 5.

Figure 3B:
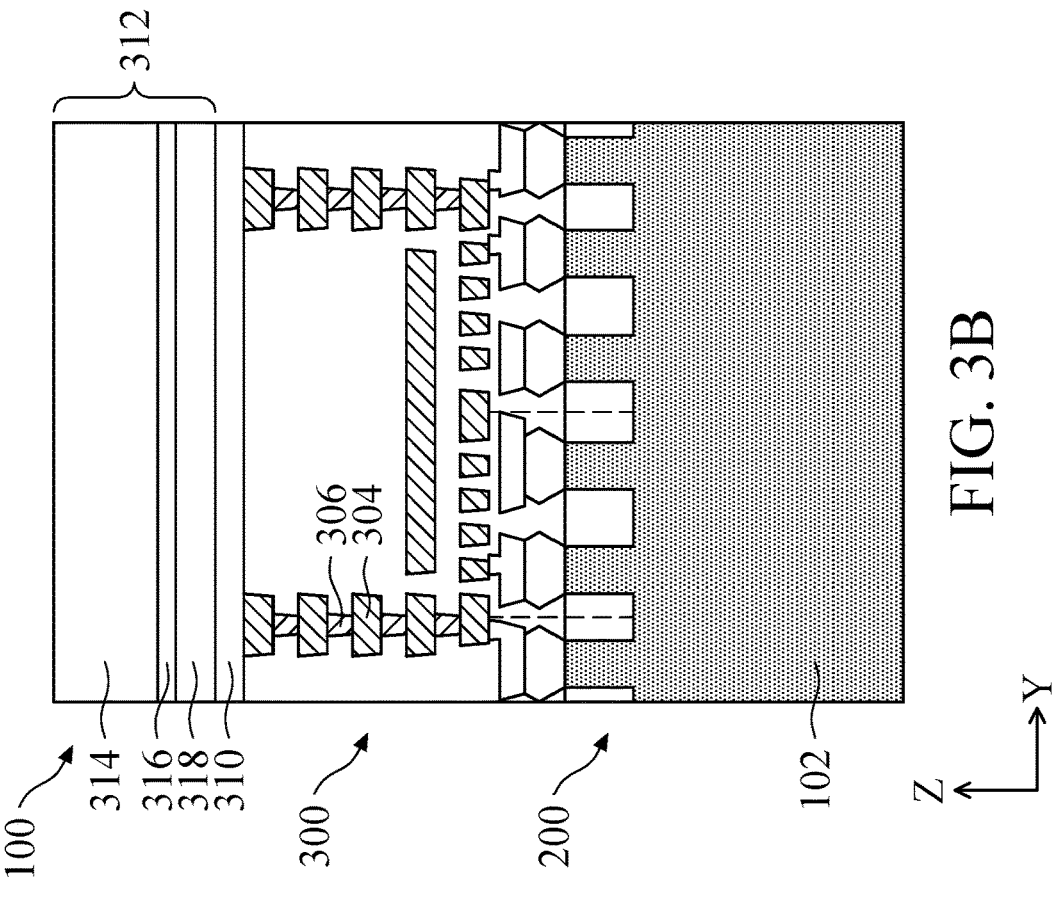
FIGS. 3A-3I are cross-sectional side views of various stages of manufacturing the semiconductor device structure, in accordance with some embodiments.
Figure 3A:
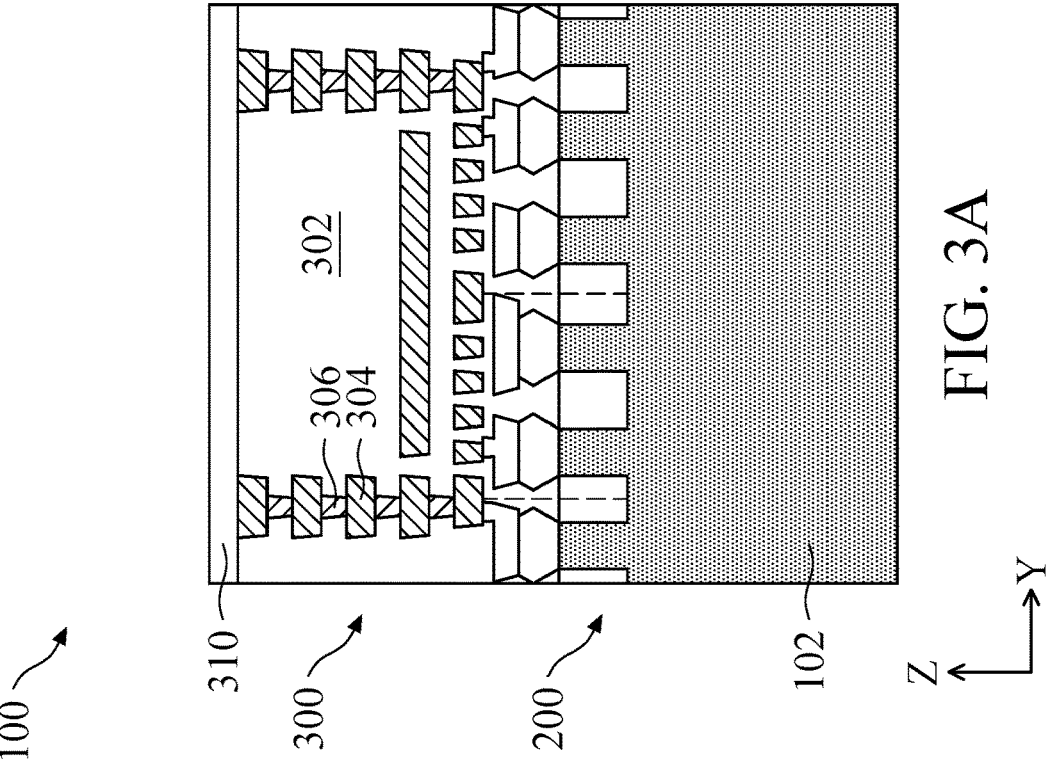

FIGS. 3A-3I are cross-sectional side views of various stages of manufacturing the semiconductor device structure 100, in accordance with some embodiments. As shown in FIG. 3A, the semiconductor device structure 100 includes the substrate 102, the devices 200, the interconnect structure 300, and a dielectric layer 310 formed on the interconnect structure 300. The dielectric layer 310 may be a bonding layer for a carrier structure 312 (FIG. 3B). In some embodiments, the dielectric layer 310 includes an oxide, such as silicon oxide. The dielectric layer 310 may have a thickness ranging from about 5 nm to about 1 micrometer. In some embodiments, the dielectric layer 310 has a surface roughness less than about 10 Angstroms.

As shown in FIG. 3B, the carrier structure 312 is bonded to the semiconductor device structure 100. The carrier structure 312 includes at least a semiconductor substrate 314, a release layer 316, and a bonding layer 318. The bonding layer 318 may include the same material as the dielectric layer 310 and may be bonded to the dielectric layer 310. The bonding layer 318 and the dielectric layer 310 may be bonded by any suitable method. In some embodiments, the carrier structure 312 includes additional layers. The carrier structure 312 is described in detail in FIG. 4.

Figures 3C, 3D:
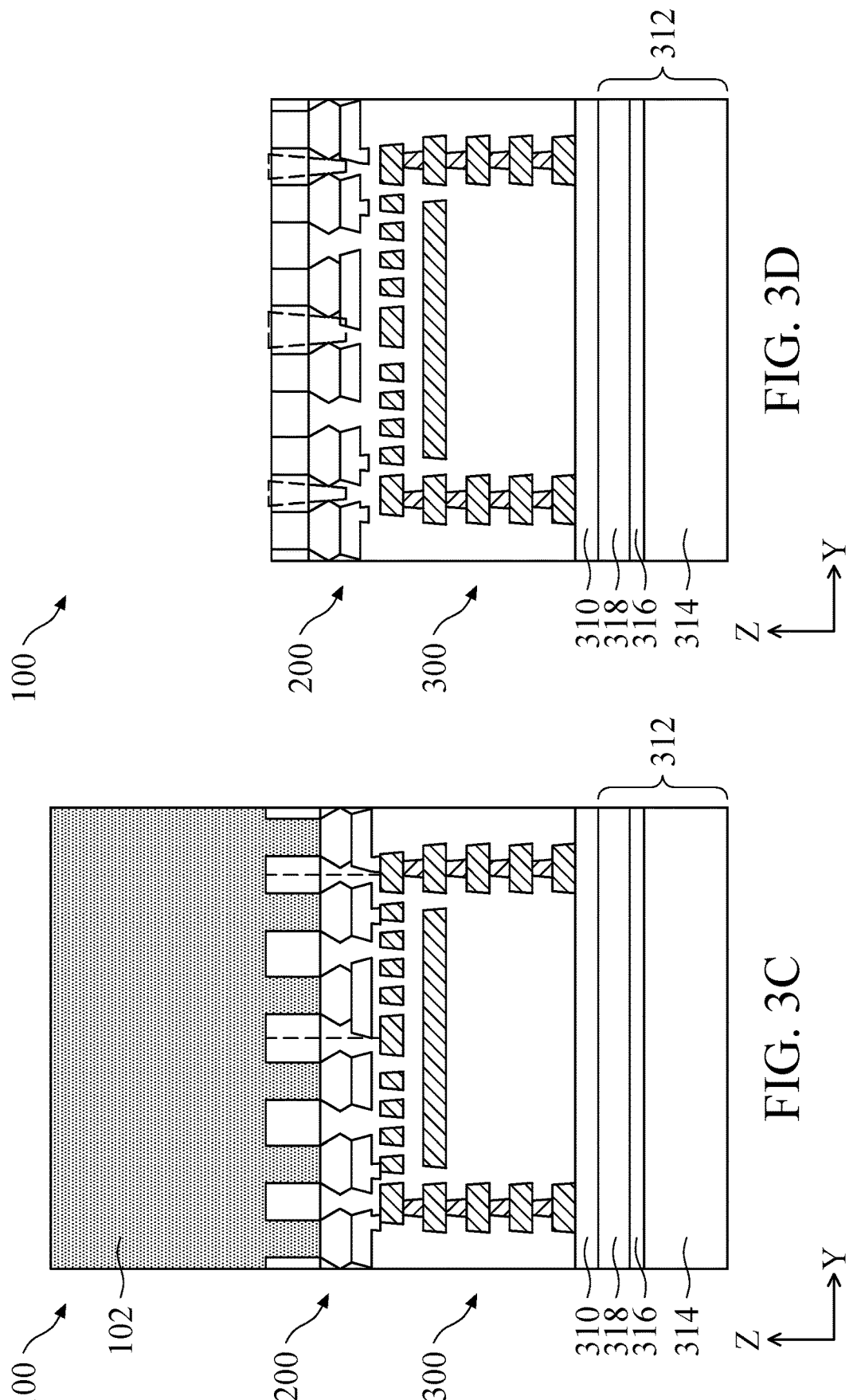
Figures 3E, 3F:
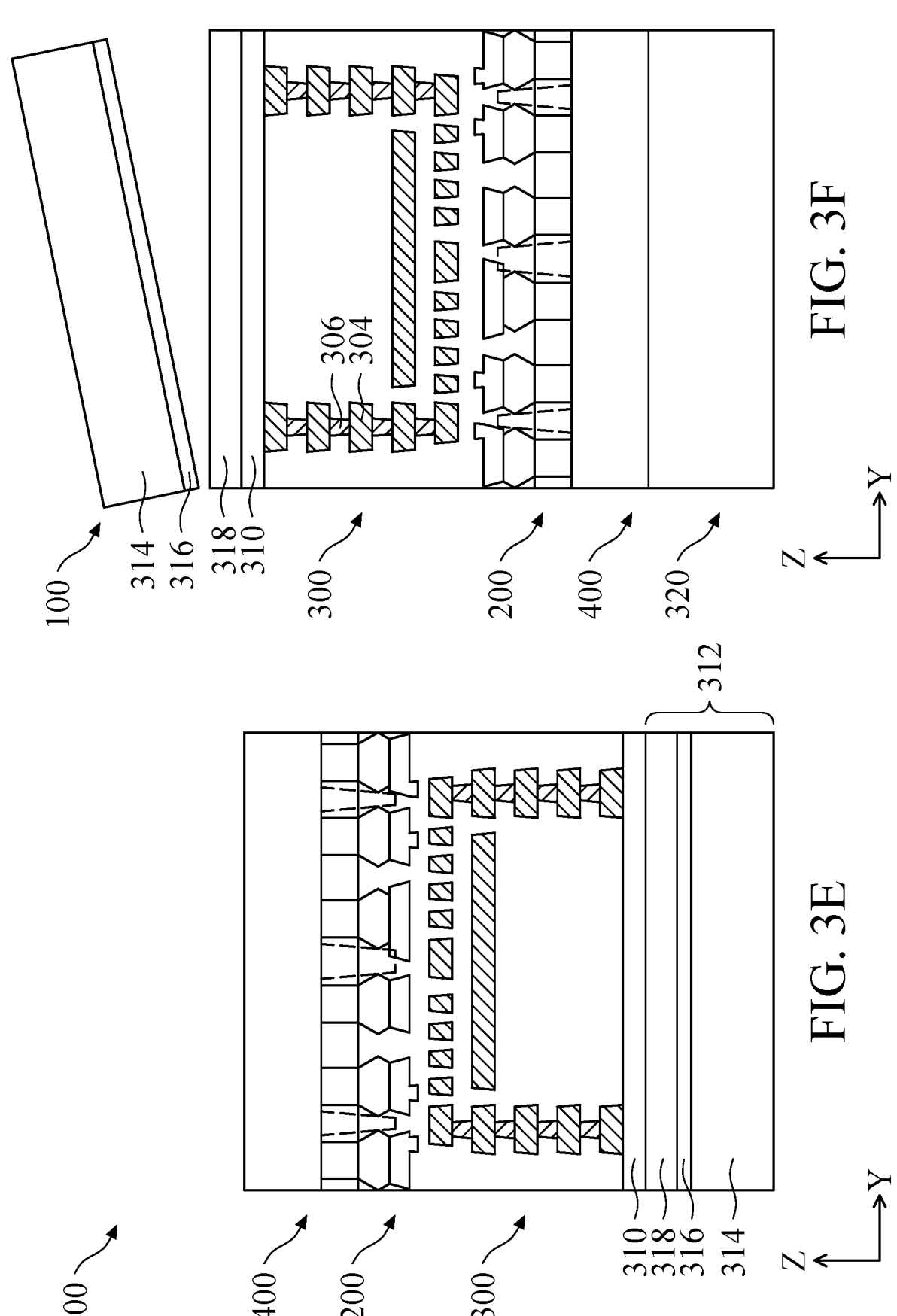

As shown in FIG. 3C, the semiconductor device structure 100 along with the carrier structure 312 are flipped over, and backside processes are performed. In some embodiments, as shown in FIG. 3D, the substrate 102 is removed. In some embodiments, as shown in FIG. 3E, a backside interconnect structure 400 is formed over the devices 200 after the removal of the substrate 102. The backside interconnect structure 400 may include the same materials as the interconnect structure 300. For example, one or more levels of conductive features (not shown), such as the conductive features 304, 306, may be embedded in an IMD layer, such as the IMD layer 302. The conductive features located in the backside interconnect structure 400 may be electrically connected to the S/D regions 124 and/or the gate electrode layer 138. By having conductive features formed on the backside of the semiconductor device structure 100, high-density signal routing may be achieved.

As shown in FIG. 3F, another carrier structure 320 is formed on the backside interconnect structure 400, and the semiconductor device structure 100 is flipped over again so the carrier structure 320 is located below the semiconductor device structure 100. In some embodiments, the carrier structure 320 includes the same layers as the carrier structure 312 and may be bonded to the backside interconnect structure 400 by the same process as the bonding of the carrier structure 312 to the dielectric layer 310.

As shown in FIG. 3F, the semiconductor substrate 314 is released from the semiconductor device structure 100. The releasing of the semiconductor substrate 314 is achieved without damaging the semiconductor substrate 314. As a result, the semiconductor substrate 314 may be reused in a carrier structure. The releasing of the semiconductor substrate 314 is described in detail in FIGS. 5A to 5C. In some embodiments, the releasing of the semiconductor substrate 314 occurs at the release layer 316, and the bonding layer 318 remains on the semiconductor device structure 100, as shown in FIG. 3F.

Figure 3H:
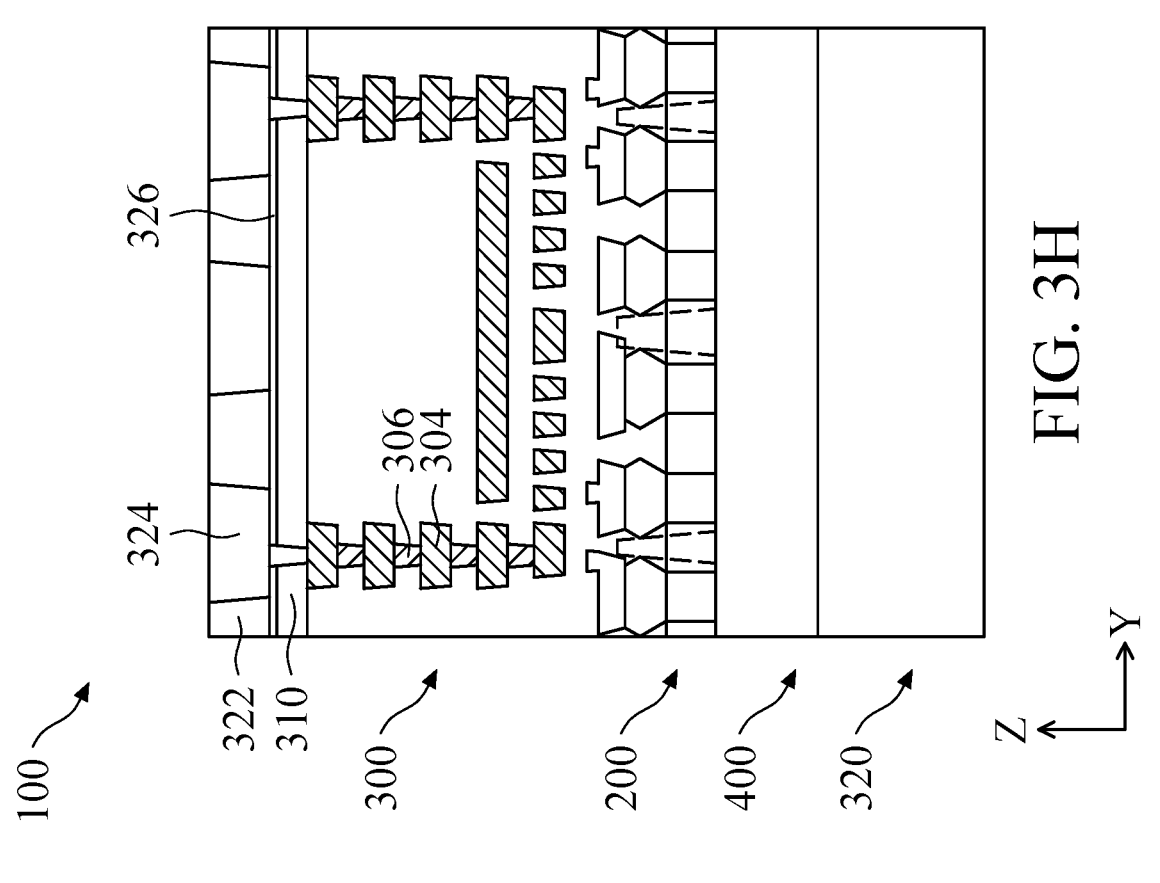
Figure 3G:
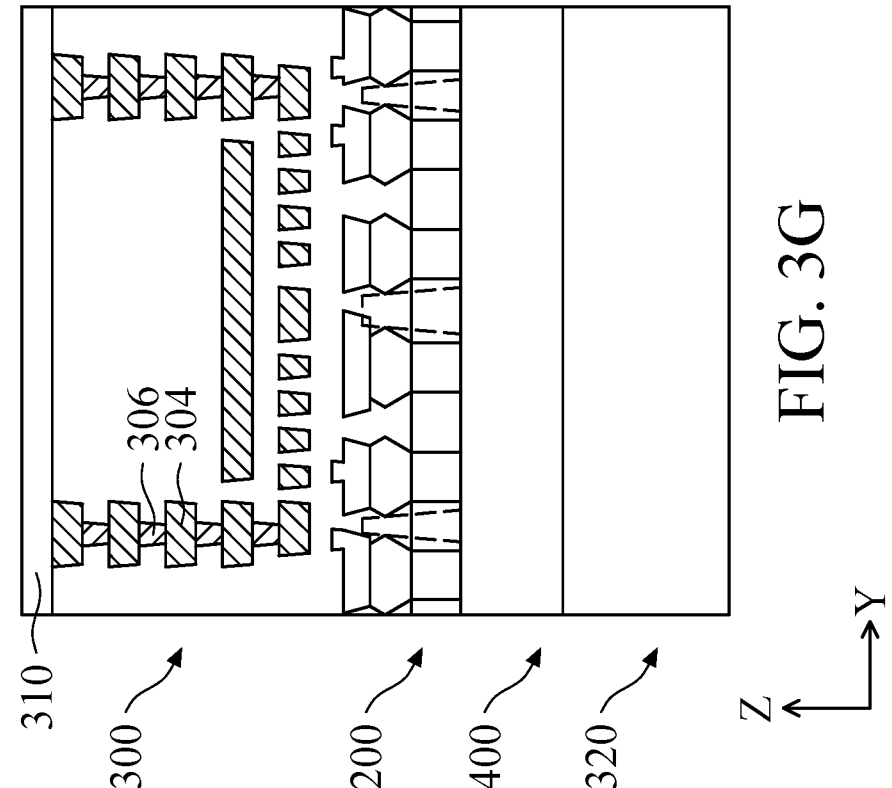
Figure 3I:
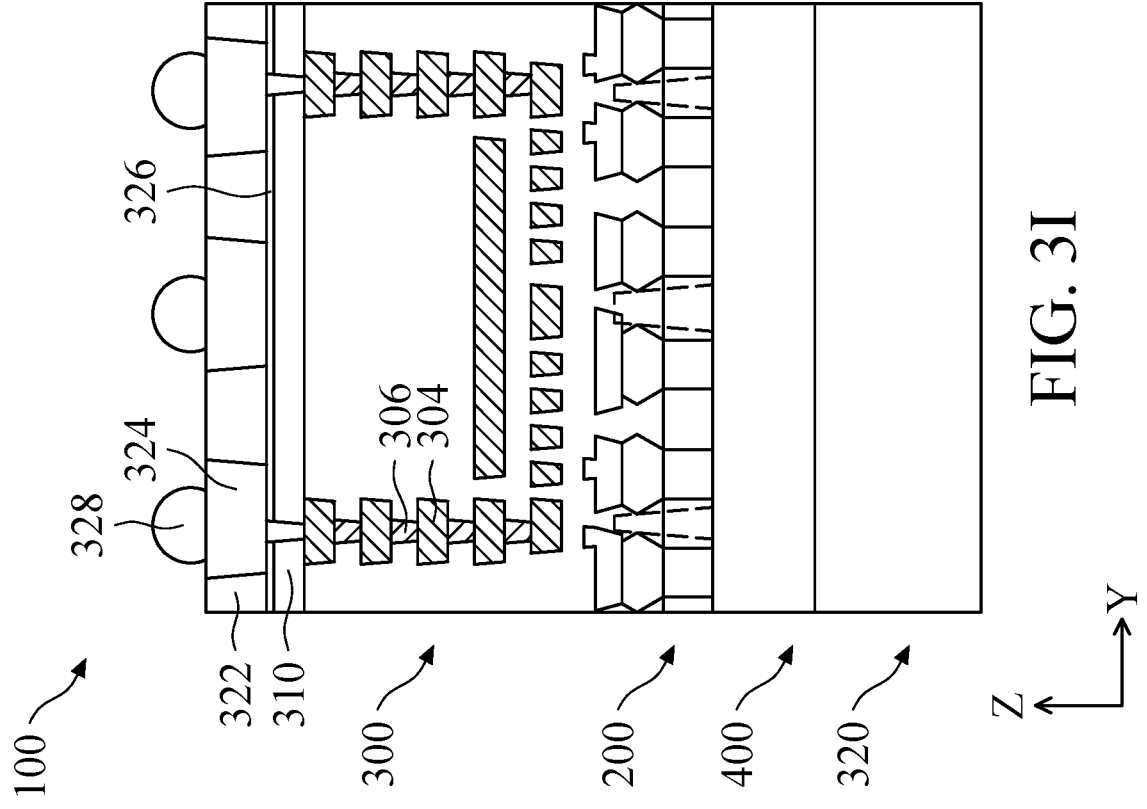

As shown in FIG. 3G, the bonding layer 318 is removed from the semiconductor device structure 100. The bonding layer 318 may be removed by any suitable method. In some embodiments, the dielectric layer 310 is also removed. As shown in FIG. 3H, a dielectric layer 322 is formed over the dielectric layer 310 (or the interconnect structure 300 if the dielectric layer 310 is removed), and conductive pads 324 are formed in the dielectric layer 322. The dielectric layer 322 may include the same material as the IMD layer 302, and the conductive pads 324 may include a conductive material, such as a metal, for example Al. In some embodiments, an etch stop layer 326 is formed between the dielectric layer 322 and the dielectric layer 310. As shown in FIG. 3I, conductive bumps 328 are formed over corresponding conductive pads 324. Subsequent processes may be performed to form stacked semiconductor device structures 100. For example, prior to forming the dielectric layer 310, the dielectric layer 322, the conductive pads 324, and the conductive bump 328, another carrier structure, such as the carrier structure 320, may be bonded to the interconnect structure 300. Next, the semiconductor device structure 100 along with the carrier structure 320 and the carrier structure bonded to the interconnect structure 300 may be flipped over, the carrier structure 320 may be removed, and another semiconductor device structure 100 is bonded to the interconnect structure 400. After the predetermined number of semiconductor device structures 100 are stacked over the interconnect structure 400, the structure may be flipped over, and the carrier structure formed on the interconnect structure 300 may be removed by any suitable process, such as the process of releasing of the semiconductor substrate 314, as described in FIG. 3F. In some embodiments, the removal of the carrier structure 320 is performed by the same process as the releasing of the semiconductor substrate 314, as described in FIG. 3F.

Figure 4:
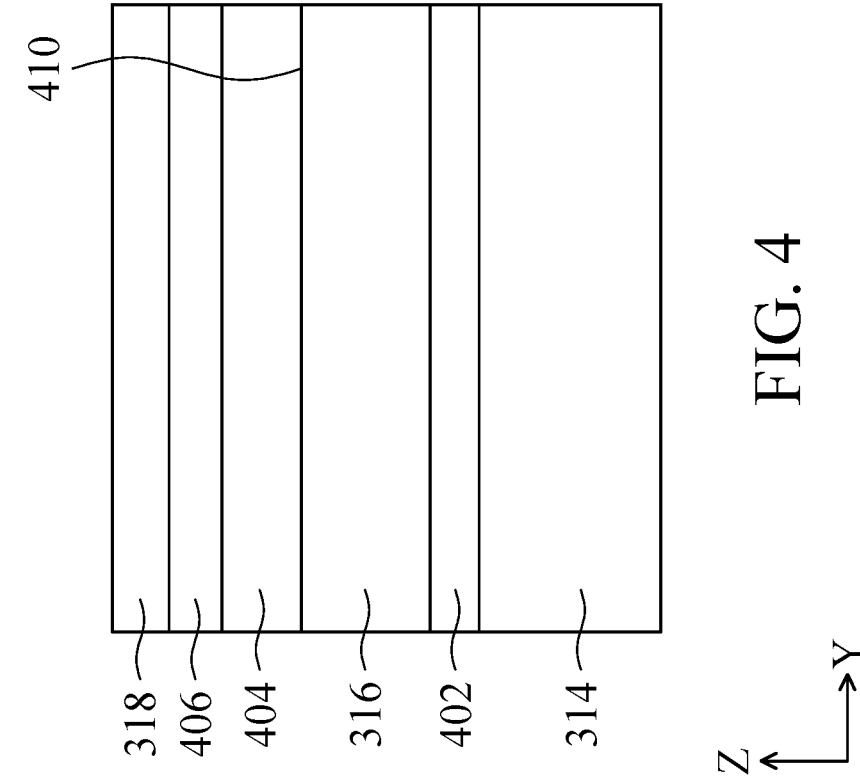
FIG. 4 is a cross-sectional side view of a carrier structure, in accordance with some embodiments.

FIG. 4 is a cross-sectional side view of the carrier structure 312, in accordance with some embodiments. In some embodiments, the carrier structure 312 includes a semiconductor substrate 314, a dielectric layer 402 disposed on the semiconductor substrate 314, the release layer 316 disposed on the dielectric layer 402, a dielectric layer 404 disposed on the release layer 316, a reflection layer 406 disposed on the dielectric layer 404, and the bonding layer 318 disposed on the reflection layer 406. The carrier structure 312 may be formed by sequentially depositing the abovementioned layers. In some embodiments, the semiconductor substrate 314 is a silicon substrate, such as a silicon wafer, for example a 200 mm silicon wafer, a 300 mm silicon wafer, or a 450 mm silicon wafer. In some embodiments, the semiconductor substrate 314 has a thickness uniformity of greater than about 99 percent and a surface roughness of less than about 10 Angstroms. Referring back to FIG. 3B, in some embodiments, both the substrate 102 and the semiconductor substrate 314 are silicon wafers. As a result, there is no coefficients of thermal expansion (CTE) mismatch of the substrate 102 and the semiconductor substrate 314.

The dielectric layer 402 may be a dielectric layer having low thermal conductivity. In some embodiments, the dielectric layer 402 is an oxide, such as silicon oxide. The dielectric layer 402 may be formed by oxidizing a portion of the semiconductor substrate 314 or by depositing an oxide layer on the semiconductor substrate 314. The dielectric layer 402 has a thickness ranging from about 50 nm to about 400 nm. The dielectric layer 402 functions as a thermal isolator between the release layer 316 and the semiconductor substrate 314. Thus, if the thickness of the dielectric layer 402 is less than about 50 nm, the heat absorbed by the release layer 316 may heat up the semiconductor substrate 314. On the other hand, if the thickness of the dielectric layer 402 is greater than about 400 nm, the manufacturing cost is increased without significant advantage.

The release layer 316 may include a metal or a metal nitride. In some embodiments, the release layer 316 includes a refractory metal or a refractory metal nitride. For example, the release layer 316 is a TiN layer. In some embodiments, the TiN layer is formed by PVD. PVD TiN layer includes columnar structures each including small crystals. The small crystals may have different lattice planes, and each may have a grain size greater than about 4 nm, such as from about 5 nm to about 13 nm. The columnar structures of the PVD TiN causes a top surface 410 of the release layer 316 to be rough, such as having a surface roughness ranging from about 0.2 nm to about 5 nm. Thus, when hitting by infrared (IR) laser lights, the release layer 316 absorbs the heat from the IR laser lights and expands, and portions of the release layer 316 are separated from the dielectric layer 404. As a result, the fracture energy at the interface between the release layer 316 and the dielectric layer 404 is low, such as less than about 10 J/m². Furthermore, the separation occurs at the interface between the release layer 316 and the dielectric layer 404. For example, the bonding layer 318, the reflection layer 406, and the dielectric layer 404 remains over the semiconductor device structure 100, while the semiconductor substrate 314, the dielectric layer 402, and the release layer 316 are separated from the semiconductor device structure 100. In some embodiments, the dielectric layer 404, the reflection layer 406, and the bonding layer 318 are removed to expose the interconnect structure 300 disposed thereunder, and the conductive pads 324 (FIG. 3H) are formed on the interconnect structure 300. By separating the semiconductor substrate 314, the dielectric layer 402, and the release layer 316 at the interface between the release layer 316 and the dielectric layer 404, the removal of the dielectric layer 404, the reflection layer 406, and the bonding layer 318 becomes easier. In some embodiments, the release layer 316 is carbon free, because carbon may contaminate the processing environment.

In some embodiments, the release layer 316 includes TiN formed by CVD, a metal nitride other than TiN, or a metal, such as Ti or Au. The TiN layer formed by CVD, the metal nitride other than TiN, or the metal form a smooth top surface 410, unlike the rough top surface 410 formed by PVD TiN. When the IR laser lights hit the carrier structure 312, the release layer 316 absorbs the heat from the IR laser lights and expands, and cracks may form within the release layer 316. As a result, the release layer 316 may be split during the releasing of the semiconductor substrate 314, and higher fracture energy may be applied to release the semiconductor substrate 314. Furthermore, an additional etch process may be performed to remove the portion of the release layer 316 remaining over the semiconductor device structure 100.

In some embodiments, the release layer 316 is a TiN layer formed by PVD and ranges from about 10 nm to about 100 nm. If the thickness of the release layer 316 is less than about 10 nm, no columnar structure is formed in the release layer 316, and the top surface 410 of the release layer 316 is smooth. On the other hand, if the thickness of the release layer 316 is greater than about 100 nm, more energy from the IR laser is needed to separate portions of the release layer 316 from the dielectric layer 404 without significant advantage.

The dielectric layer 404 may be a dielectric layer having low thermal conductivity. In some embodiments, the dielectric layer 404 is an oxide, such as silicon oxide. The dielectric layer 402 may be formed by depositing an oxide layer using TEOS precursor on the semiconductor substrate 314. The dielectric layer 404 has a thickness ranging from about 300 nm to about 600 nm. The dielectric layer 404 functions as a thermal isolator between the release layer 316 and the reflection layer 406. Thus, if the thickness of the dielectric layer 404 is less than about 300 nm, the heat absorbed by the reflection layer 406 may cause the reflection layer 406 to expand and to separate from the dielectric layer 404 or the bonding layer 318. On the other hand, if the thickness of the dielectric layer 404 is greater than about 600 nm, the manufacturing cost is increased without significant advantage. In some embodiments, the reflection layer 406 includes a material that expands at a lower temperature than the material of the release layer 316, and the thickness of the dielectric layer 404 is substantially greater than the thickness of the dielectric layer 402.

The reflection layer 406 includes a material that can absorb or reflect IR light. Because the semiconductor substrate 314 and the dielectric layers 402, 404 are transparent to the IR light, the reflection layer 406 absorbs or reflects any IR light that is not absorbed by the release layer 316. The reflection layer 406 protects the conductive features 304, 306 located in the interconnect structure 300, because the conductive features 304, 306 are opaque to IR light. If the reflection layer 406 is formed of a material transparent to the IR light, the IR light can pass through the reflection layer 406 and heat the conductive features 304, 306, which may lead to localized heating of the interconnect structure 300. In some embodiments, the reflection layer 406 includes a metal, such as Cu, Ru, or other suitable metal, or a metal nitride, such as TiN, TaN, or other suitable metal nitride. In some embodiments, the reflection layer 406 includes the same material as the release layer 316. In some embodiments, the reflection layer 406 and the release layer 316 includes different materials. The reflection layer 406 has a thickness ranging from about 10 nm to about 50 nm. If the thickness of the reflection layer 406 is less than about 10 nm, the risk of the IR light reaches the conductive features 304, 306 is increased. On the other hand, if the thickness of the reflection layer 406 is greater than about 50 nm, the manufacturing cost is increased without significant advantage. In some embodiments, the surface roughness of the reflection layer 406 is less than about 10 Angstroms.

The bonding layer 318 may include a dielectric material, such as silicon oxide. The bonding layer 318 may have a thickness ranging from about 10 nm to about 2 microns. The bonding layer 318 may have a surface roughness less than about 10 Angstroms.

Figures 5A, 5B:
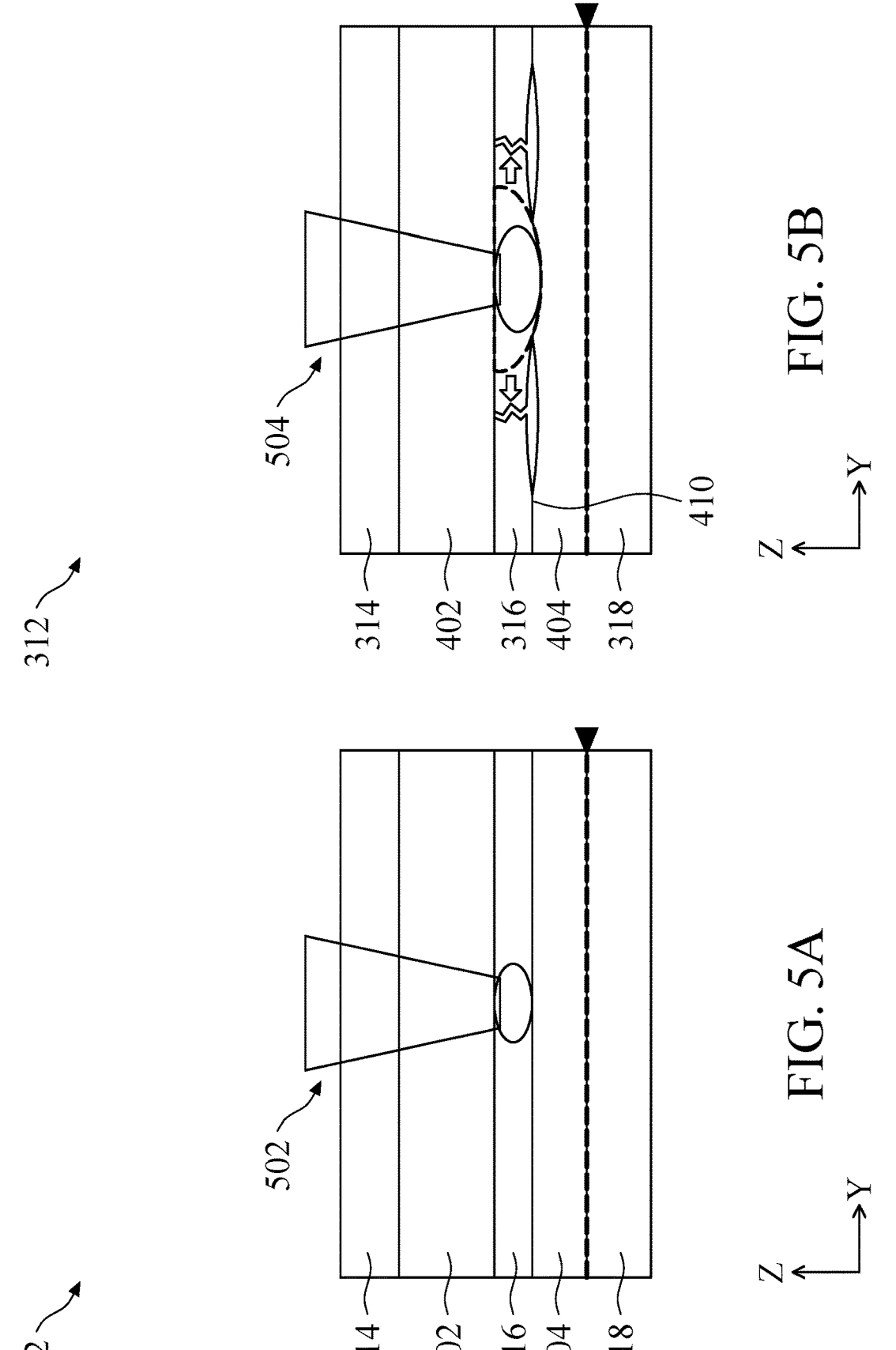
FIGS. 5A-5C are cross-sectional side views of the carrier structure being heated by a laser, in accordance with some embodiments.
Figure 5C:
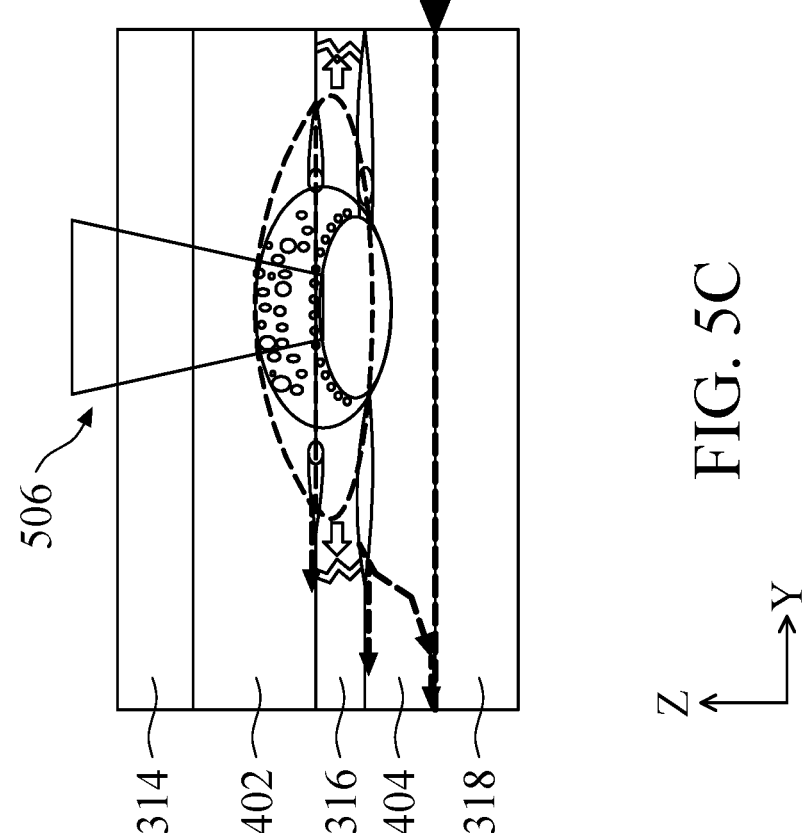

FIGS. 5A-5C are cross-sectional side views of the carrier structure 312 being heated by a laser, in accordance with some embodiments. The carrier structure 312 is disposed over the semiconductor device structure 100, and the reflection layer 406 and the semiconductor device structure 100 are omitted for clarity in FIGS. 5A to 5C. As shown in FIG. 5A, a light 502, such as an IR light, from a laser, such as an IR laser, passes through the semiconductor substrate 314 and the dielectric layer 402, and is absorbed by the release layer 316. The laser may be a femtosecond (fs) IR laser, and the light 502 may have a pulse duration of around 100 fs. The photon in the light 502 cause the electron collision and heating in the release layer 316. However, the light 502 does not cause portions of the release layer 316 to be separated from the dielectric layer 404.

As shown in FIG. 5B, a light 504, such as an IR light, from a laser, such as an IR laser, passes through the semiconductor substrate 314 and the dielectric layer 402, and is absorbed by the release layer 316. The laser may be a picosecond (ps) IR laser, and the light 504 may have a pulse duration ranging from about 10 ps to about 100 ps. The light 504 causes lattice heating in the release layer 316, and spallation may occur. The laser induced spallation leads to stress in the release layer 316 due to the thermal expansion of the release layer 316. As described above, in some embodiments, the release layer 316 is a TiN layer formed by PVD and includes a rough top surface 410 (now the bottom surface after the carrier structure 312 is bonded to the semiconductor device structure 100). Portions of the rough top surface 410 are separated from the dielectric layer 404 as a result of the laser induced spallation. In some embodiments, cracks may be formed in the release layer 316, as shown in FIG. 5B. After the release layer 316 is exposed to the light 504 multiple times at various locations, large portions of the top surface 410 of the release layer 316 are separated from the dielectric layer 404. The remaining portion of the release layer 316 still attaching to the dielectric layer 404 may be separated from the dielectric layer 404 by a subsequent de-bonding process. The de-bonding force applied in the debonding process to separate the entire release layer 316 and the dielectric layer 404 after the exposure to the lights 504 is substantially small, such as less than about 13 J/m². In some embodiments, the debonding process includes inserting a wedge between the release layer 316 and the dielectric layer 404. In some embodiments, the debonding process includes applying suction forces to the semiconductor substrate 314 and the substrate 102 and then pulling away from each other.

As shown in FIG. 5C, a light 506, such as an IR light, from a laser, such as an IR laser, passes through the semiconductor substrate 314 and the dielectric layer 402, and is absorbed by the release layer 316. The laser may be a nanosecond (ns) IR laser, and the light 506 may have a pulse duration ranging in the nanosecond range. The light 506 causes decomposition and evaporation of the release layer 316, and phase explosion and plasma formation may occur. As a result, in addition to the portions of the release layer 316 being separated from the dielectric layer 404, portions of the release layer 316 may be also separated from the dielectric layer 402, and cracks may also form in the dielectric layers 402, 404. During the subsequent debonding process, the separation of the carrier structure 312 from the semiconductor device structure 100 is not clean and may occur at multiple layers.

The ns IR laser and the ps IR laser both can cause portions of the release layer 316 to be separated from the dielectric layer 404. However, the ps IR laser can cause a clean separation of the release layer 316 from the dielectric layer 404, while the ns IR laser may separate the carrier structure 312 from the semiconductor device structure 100 across multiple layers, such as the dielectric layer 402, the release layer 316, and the dielectric layer 404, which leads to more complex removal processes in order to expose the interconnect structure 300.

In some embodiments, the IR laser may have a depth of focus ranging from about 10 microns to about 100 microns, a laser energy ranging from about 2 μJ to about 8 μJ, a power density ranging from about 10E14 μJ/m² to about 10E16 μJ/m². In some embodiments, the IR laser imprint diameter ranging from about 10 microns to about 100 microns, and the IR laser line pitch distance ranges from about 10 microns to about 100 microns.

The carrier structure 312 and the method of removing the carrier structure 312 from a structure may be used in any suitable applications. For example, the carrier structure 312 may be used in integrated fan out (InFO) package technology. In some embodiments, dies may be placed on the carrier structure 312 instead of a carrier structure including a glass substrate. In some embodiments, because the dies include silicon substrates, the risk of coefficient of thermal expansion (CTE) mismatch between the silicon substrates of the dies and the semiconductor substrate 314 of the carrier structure 312 is low compared to a glass substrate of a different carrier structure.

The present disclosure in various embodiments provides a carrier structure and methods of forming the same. In some embodiments, the carrier structure includes a semiconductor substrate 314, a first dielectric layer 402 disposed on the semiconductor substrate 314, a release layer 316 disposed on the first dielectric layer 402, a second dielectric layer 404 disposed on the release layer 316, a reflection layer 406 disposed on the second dielectric layer 404, and a bonding layer 318 disposed on the reflection layer 406. The release layer 316 is a carbon free metal nitride layer. Some embodiments may achieve advantages. For example, the semiconductor substrate 314 and the substrate 102 include the same material, and there is no CTE mismatch. Furthermore, the carbon free metal nitride layer can lead to a clean separation at the interface of the release layer 316 and the dielectric layer 404, leading to easier etch processes to expose the interconnect structure 300. In addition, the semiconductor substrate 314 is not damaged during the separation and may be reused to save cost.

An embodiment is a method. The method includes forming one or more devices over a substrate, forming a first interconnect structure over the one or more devices, and bonding the first interconnect structure to a carrier structure. The carrier structure includes a semiconductor substrate, a release layer, and a first dielectric layer, and the release layer includes a metal nitride. The method further includes flipping over the one or more devices so the carrier structure is located at a bottom, performing backside processes, flipping over the one or more devices so the carrier structure is located at a top, and exposing the carrier structure to IR lights. Portions of the release layer are separated from the first dielectric layer.

Another embodiment is method. The method includes forming a carrier structure including depositing a first dielectric layer on a semiconductor substrate and depositing a release layer on the first dielectric layer by a physical vapor deposition process. The release layer includes TiN. The forming the carrier structure further includes depositing a second dielectric layer on the release layer, depositing a reflection layer on the second dielectric layer, and depositing a bonding layer on the reflection layer. The method further includes bonding the carrier structure to a semiconductor device structure, flipping over the semiconductor device structure, performing one or more processes on the semiconductor device structure, and removing the carrier structure.

A further embodiment is a carrier structure. The structure includes a semiconductor substrate, a first dielectric layer disposed on the semiconductor substrate, and a release layer disposed on the first dielectric layer. The release layer is carbon free and includes a metal nitride. The structure further includes a second dielectric layer disposed on the release layer, a reflection layer disposed on the second dielectric layer, and a bonding layer disposed on the reflection layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:
forming one or more devices over a substate;
forming a first interconnect structure over the one or more devices;
bonding the first interconnect structure to a carrier structure, wherein the carrier structure comprises a semiconductor substate, a release layer, and a first dielectric layer, and the release layer comprises a metal nitride;
flipping over the one or more devices so the carrier structure is located at a bottom;
performing backside processes;
flipping over the one or more devices so the carrier structure is located at a top; and
exposing the carrier structure to IR lights, wherein portions of the release layer are separated from the first dielectric layer.

2. The method of claim 1, wherein the one or more devices comprise transistors, diodes, imaging sensors, resistors, capacitors, inductors, memory cells, or a combination thereof.

3. The method of claim 1, wherein the backside processes comprise removing the substate and forming a second interconnect structure on the one or more devices.

4. The method of claim 1, wherein the IR lights are from a picosecond IR laser.

5. The method of claim 4, wherein a pulse duration of the IR lights ranges from 10 ps to 100 ps.

6. The method of claim 1, wherein the release layer comprises TiN.

7. The method of claim 6, wherein the release layer is deposited by physical vapor deposition.

8. The method of claim 1, wherein during the exposing the carrier structure to the IR lights, the IR lights are absorbed by the release layer.

9. The method of claim 8, wherein the IR lights cause lattice heating of the release layer, and the portions of the release layer are separated from the first dielectric layer by spallation.

10. A method, comprising:
forming a carrier structure, comprising:
depositing a first dielectric layer on a semiconductor substrate;
depositing a release layer on the first dielectric layer by a physical vapor deposition process, wherein the release layer comprises TIN;
depositing a second dielectric layer on the release layer;
depositing a reflection layer on the second dielectric layer; and
depositing a bonding layer on the reflection layer;
bonding the carrier structure to a semiconductor device structure;
flipping over the semiconductor device structure;
performing one or more processes on the semiconductor device structure; and
removing the carrier structure.

11. The method of claim 10, wherein the semiconductor device structure comprises one or more devices and an interconnect structure disposed over the one or more devices.

12. The method of claim 10, wherein the removing the carrier structure comprises exposing the carrier structure to IR lights.

13. The method of claim 12, wherein each of the IR lights has a pulse duration ranging from 10 picoseconds to 100 picoseconds.

14. The method of claim 13, wherein the IR lights are generated from an IR laser.

15. The method of claim 14, wherein the IR laser is a picosecond IR laser.

16. The method of claim 12, wherein the removing the carrier structure further comprises applying a debonding force.

17. The method of claim 16, wherein the debonding force is less than 13 J/m$^2$.

18. A method, comprising:
forming one or more devices over a substate;
forming an interconnect structure over the one or more devices;
bonding the interconnect structure to a carrier structure, wherein the carrier structure comprises a semiconductor substate, a first dielectric layer, a metal nitride layer, a second dielectric layer, a reflection layer, and a bonding layer; and
exposing the carrier structure to IR lights, wherein portions of the metal nitride layer are separated from the first dielectric layer.

19. The method of claim 18, wherein a thickness of the metal nitride layer ranges from 10 nm to 100 nm.

20. The method of claim 18, wherein the metal nitride layer comprises TiN and is formed by a physical vapor deposition process.

* * * * *